(12) United States Patent
Box et al.

(10) Patent No.: US 7,397,538 B2
(45) Date of Patent: Jul. 8, 2008

(54) RADIATION SYSTEM AND LITHOGRAPHIC APPARATUS

(75) Inventors: Wilhelmus Josephus Box, Eksel (BE); Derk Jan Wilfred Klunder, Geldrop (NL); Maarten Marinus Johannes Wilhelmus Van Herpen, Heesch (NL); Niels Machiel Driessen, Valkenswaard (NL); Hendrikus Gijsbertus Schimmel, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/602,475

(22) Filed: Nov. 21, 2006

(65) Prior Publication Data

US 2007/0115445 A1 May 24, 2007

Related U.S. Application Data

(63) Continuation-in-part of application No. 11/285,393, filed on Nov. 23, 2005.

(51) Int. Cl.
*G03B 27/54* (2006.01)
*G03B 27/42* (2006.01)
*G21G 5/00* (2006.01)

(52) U.S. Cl. .................. 355/67; 355/53; 250/492.2
(58) Field of Classification Search ............ 355/67, 355/75, 69, 53; 250/492.1, 492.2; 438/689; 378/156
See application file for complete search history.

(56) References Cited

U.S. PATENT DOCUMENTS

| 7,212,274 B2* | 5/2007 | Hara et al. ............ 355/30 |
| 2003/0045098 A1* | 3/2003 | Verhaverbeke et al. ...... 438/689 |
| 2006/0175558 A1* | 8/2006 | Bakker et al. ............ 250/492.2 |

FOREIGN PATENT DOCUMENTS

| EP | 1 491 963 A2 | 12/2004 |
| EP | 1 491 963 A3 | 8/2005 |

* cited by examiner

*Primary Examiner*—Peter B Kim
(74) *Attorney, Agent, or Firm*—Pillsbury Winthrop Shaw Pittman, LLP

(57) ABSTRACT

The invention relates to a radiation system for generating a beam of radiation. The radiation system includes an extreme ultraviolet source constructed and arranged to generate extreme ultraviolet radiation, a contamination barrier constructed and arranged to trap contamination from the radiation source, and a temperature sensor constructed and arranged to sense a temperature of the contamination barrier.

30 Claims, 6 Drawing Sheets

RADIATION SYSTEM AND LITHOGRAPHIC APPARATUS

CROSS-REFERENCE TO RELATED APPLICATIONS

The present application is a continuation-in-part of U.S. patent application Ser. No. 11/285,393, which was filed on Nov. 23, 2005 and is currently pending, the entire content of which is hereby incorporated by reference.

FIELD

The present invention relates to a radiation system and a lithographic apparatus that includes the radiation system. Specifically, the invention relates to a radiation system that includes an extreme ultraviolet radiation source that generates extreme ultraviolet radiation, and a contamination barrier for trapping contamination from the radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In addition to extreme ultraviolet (EUV) radiation, radiation sources used in EUV lithography generate contaminant material that is harmful for the optics and the working environment in which the lithographic process is carried out. Such is especially the case for EUV sources operating via a laser induced plasma or discharge plasma. Hence, in EUV lithography, a desire exists to limit the contamination of the optical system that is arranged to condition the beams of radiation coming from an EUV source. To this end, a contamination barrier can be used that traps the contamination from an EUV source. One example of a contamination barrier is for instance disclosed in EP1491963. This publication describes a so called foil trap, a device that uses a high number of closely packed foils aligned generally parallel to the direction of the light generated by the EUV source. Contaminant debris, such as micro-particles, nano-particles and ions can be trapped in walls provided by foil plates. Thus, the foil trap functions as a contamination barrier trapping contaminant material from the source. Generally, these foil traps are designed to have a sufficiently large dimension to trap virtually any contaminant particle traveling through the trap. However, illumination results in a relatively high heat load of the contamination barrier. A high temperature can cause many problems, such as tin evaporation and consequently reduced debris suppression or undesired mechanical deformation of the contamination barrier. Therefore, the temperature of the contamination barrier should be monitored during EUV operation.

SUMMARY

It is an aspect of the present invention to provide a radiation system that includes a contamination barrier that functions at an optimal working temperature. To this end, a radiation system for generating a beam of radiation is provided. The radiation system includes an extreme ultraviolet radiation source constructed and arranged to generate extreme ultraviolet radiation, a contamination barrier constructed and arranged to trap contamination from the radiation source, and a temperature sensor constructed and arranged to measure a temperature of the contamination barrier.

According to a further embodiment of the invention, a radiation system may be provided with a temperature control system constructed and arranged to control the temperature of the contamination barrier.

According to an embodiment of the invention, a lithographic apparatus is provided. The lithographic apparatus includes a radiation system constructed and arranged to generate a beam of radiation. The radiation system includes an extreme ultraviolet radiation source constructed and arranged to generate extreme ultraviolet radiation, a contamination barrier constructed and arranged to trap contamination from the radiation source, and a temperature sensor constructed and arranged to measure a temperature of the contamination barrier. The apparatus also includes a patterning device constructed and arranged to pattern the beam of radiation, and a projection system constructed and arranged to project the patterned beam of radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
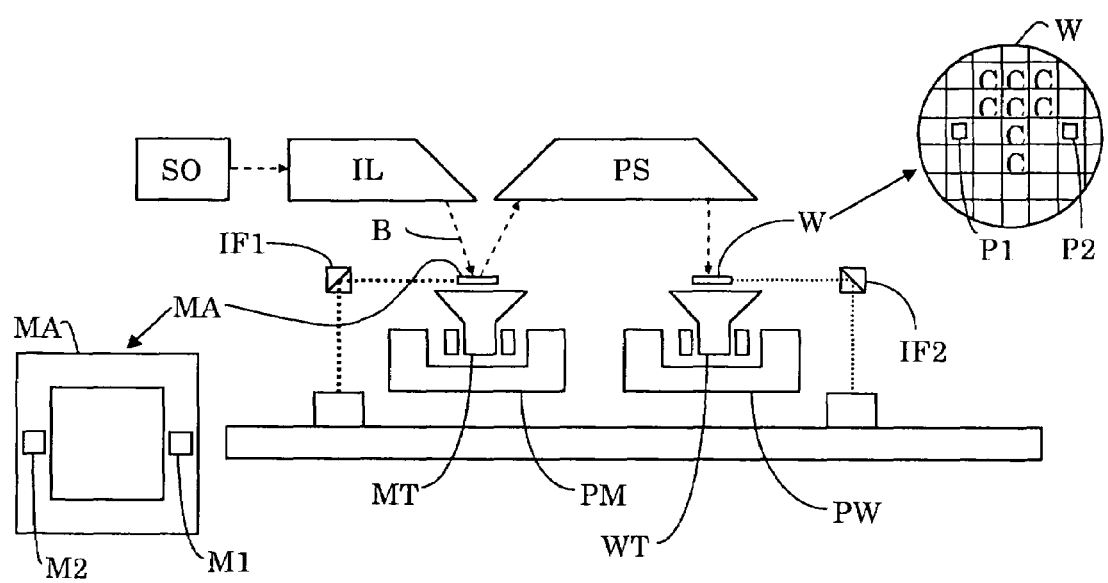
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems. or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode. generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
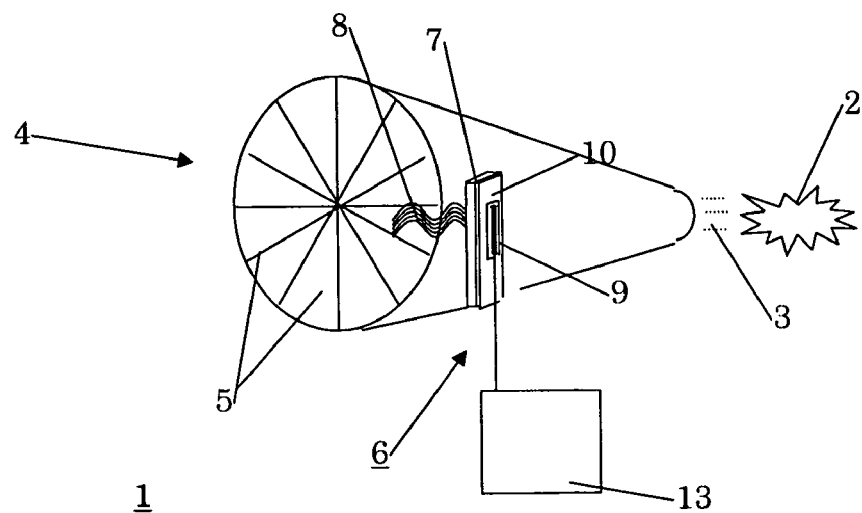
FIG. 2 depicts a first embodiment of the invention.

In FIG. 2, a first embodiment of a radiation system 1 according to the invention is depicted. Typically, the radiation system 1 may comprise a plasma source 2 such as a Tin, Lithium or Xenon source, however, other sources are possible. The source 2 depicted in FIG. 2 is typically operated in a pulsed way so that periodically EUV radiation 3 is generated in conjunction with contamination debris (not shown) traveling from the source 2. A rotating foil trap device 4 is mounted in front of the EUV source 2. Contaminant debris, such as micro-particles, nano-particles and ions can be trapped in walls provided by foil plates 5. Thus, the foil trap 4 functions as a contamination barrier trapping contaminant material from the source 2. However, due to the heat irradiation of the foil trap 4 by the source 2, the foil trap is heated to high temperatures, in particular, temperatures well above the melting point of Tin. This can be undesirable since such high temperatures may lead to Tin evaporation, which may cause contamination of the lithographic system, and consequently a reduced debris suppression of the foil trap 4 and possibly undesired mechanical deformation of the foils 5 in the foil trap 4. Accordingly, the invention proposes a temperature sensor arranged for measuring a temperature of said contamination barrier. Through monitoring of the temperature of the foil trap 4, the temperature thereof can be kept within acceptable bounds, and if the foil trap temperature becomes too high, appropriate measures can be taken in an automated manner or semi-automatically, such as shutting down the source, shielding the source, or reducing a pulse rate of the source, or increasing a cooling action to keep the temperature of the foil trap 4 within acceptable limits.

The arrangement of FIG. 2 shows an embodiment that includes a contactless temperature sensing arrangement 6, which may greatly reduce measuring difficulties in contrast to direct temperature sensing of the foil trap 4. Indeed, a direct temperature sensing arrangement, though not excluded from the claims of the invention, may be less advantageous since it may introduce wiring problems, especially for the embodiments as shown in the drawing, namely, of a rotating foil trap type. In addition, potential shielding of EUV radiation due to the temperature sensor can occur. Alternative embodiments may include a contamination barrier of a rotating type wherein said temperature sensor is coupled to a rotation axis of the contamination barrier as a temperature indication.

The temperature sensor 6 shown in the drawing comprises a metal plate 7 facing the foil trap 4 to be heated by said contamination barrier through heat radiation 8. The metal plate 7 acts as a heat sink, acquiring radiated heat from the foil trap 4. Indirectly, through the heat acquired by the metal plate 7, a thermocouple sensor 9 is heated that is mounted on the backside 10 of the metal plate 7, i.e. the side that is not facing the foil trap 4. This side 10 is further thermally isolated from the environment, to prevent heat leaks from the metal plate 7. Thus, the thermocouple sensor 9 measures accurately the temperature of the heated metal plate 7. Accordingly, the temperature can be measured contactlessly. Radiation theory can relate the temperature of the metal plate 7 with the temperature of the foil trap 4, via a calibration factor which can be properly established. A more detailed discussion of this theory will follow referring to FIG. 4 and FIG. 5 in which an apparent emissivity factor will be taken into account.

Figure 3:
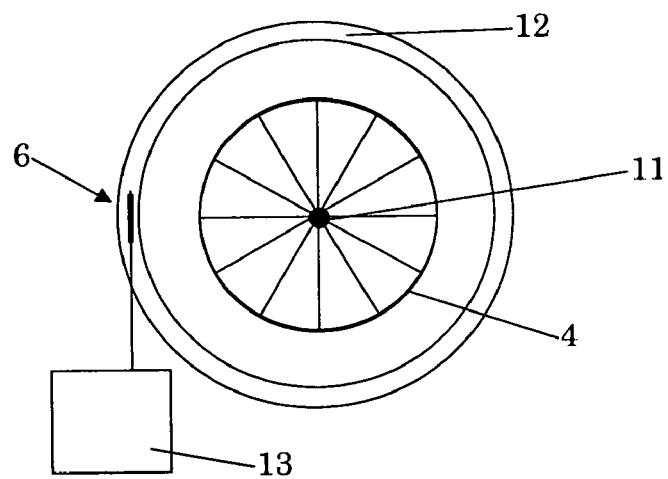
FIG. 3 depicts a second embodiment of the invention.

The illustrated contact-less setup of FIG. 2 is generally robust to EUV radiation and/or contamination debris, in particular, Tin that is emitted from a Tin source. Advantageously, the metal plate 7 comprises a Tin layer and/or is formed conform a geometry of the contamination barrier. For the rotating foil trap 4 illustrated in the figure, this means that the plate has a form that is partly cylindrical or conical with a curvature which is concentric with a rotational axis 11 of the foil trap 4 (as indicated in FIG. 3). The setup can be dimensioned relatively small and an estimated accuracy can be about 10K. Another possibility of sensing the temperature is via a pyrometer (not shown), which may be used to directly sense incoming heat radiation. Such a pyrometer tends to be bulky and sensitive to debris, because the measurement requires that the path between the foil trap and the pyrometer is reasonably transparent for infrared radiation. However, through appropriate shielding against debris or through cleaning or replacing the optical components a contactless temperature measurement may be possible.

FIG. 3 shows a further embodiment which is a variation of the embodiment depicted in FIG. 2. In this embodiment, a heater 12 is placed around a rotating foil trap 4 of the kind illustrated in FIG. 2. The heater 12 may typically comprise a metal hull enclosing the foil trap 4, of a cylindrical or conical form and concentric with the symmetry axis of the foil trap 4. In addition, although in FIG. 2 a foil trap of a rotating type is illustrated, other types, in particular, static types, may be used also. The heater 12 may be used to heat the foil trap 4 to a certain desired working temperature prior to turning on the EUV source 2. In this embodiment the temperature sensor 6 thus may have a multifold function including detecting a heater temperature in an on-condition of the heater 12, and detecting a rotating foil trap temperature in an off-condition of the heater 12. To this end, the sensor 6 is coupled to processing circuitry 13, which can provide appropriate control of the heater 12 and/or the rotating foil trap temperature. Reference numeral 11 indicates a rotational axis of the foil trap 4

Figure 4:
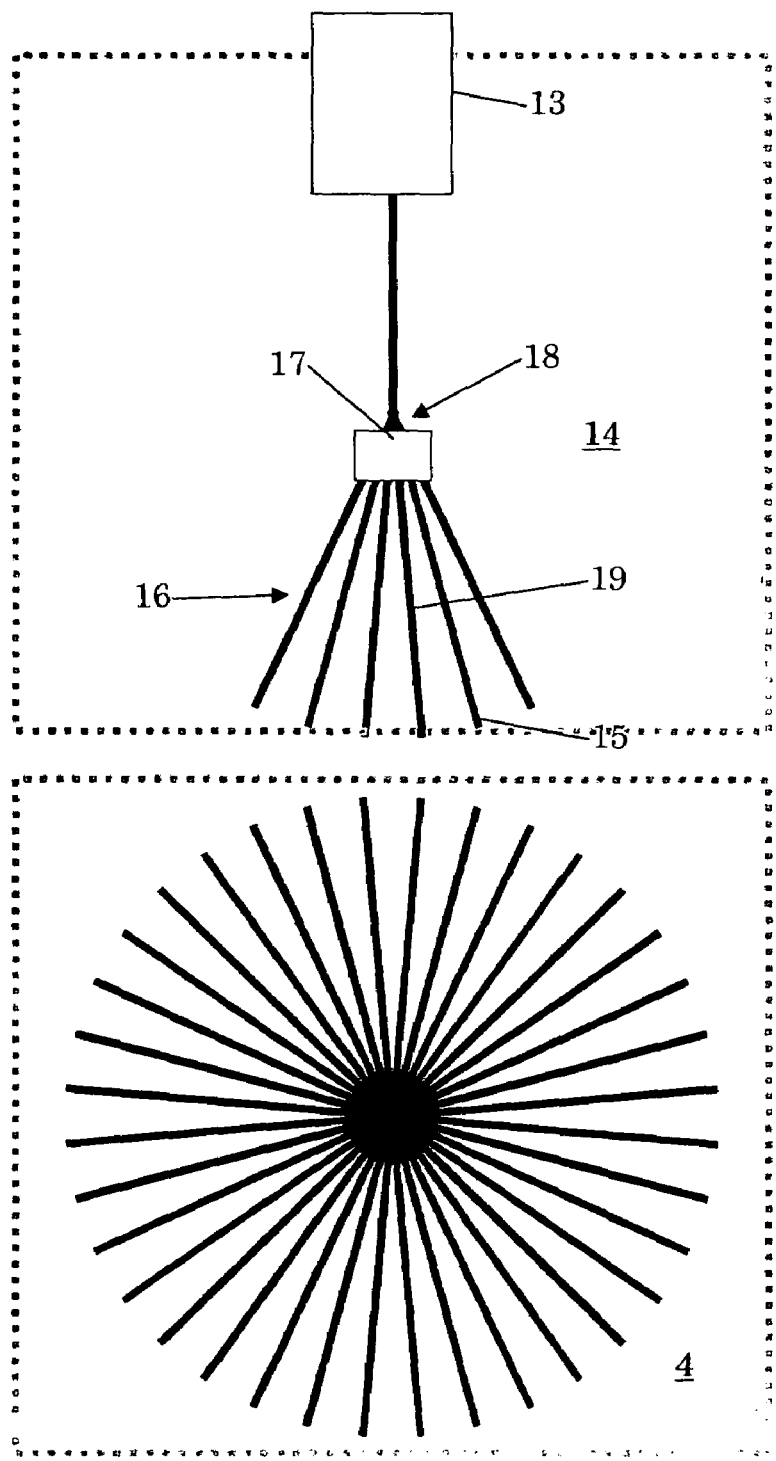
FIG. 4 depicts another embodiment of the invention.

FIG. 4 shows a variation of the embodiment of the contactless temperature sensing arrangement disclosed in FIG. 2. The calibration factor referred to previously, is related to the apparent emissivity fraction E known from radiation theory. This fraction is related to the material and geometric properties of the radiating body relative to a blackbody radiation. With a changing surface and or shape of the foil trap 4 and/or probe 14, this factor may vary, thus impeding proper temperature measurement of the foil trap 4.

Where for blackbody radiation, the Stefan Boltzmann relation holds for the radiated thermal energy $W_b$ per unit surface area:

$$W_b = \sigma \cdot T^4 \qquad \text{Eq 1}$$

for a radiative body having an apparent emissivity of $\epsilon$ the radiated thermal energy per unit surface area is $$W = \epsilon \cdot W_h \qquad \text{Eq 2}$$

Accordingly, a temperature relation between the foil trap $T_{FT}$ and a measuring probe $T_{probe}$ holds:

$$T_{FT} = \left(\frac{\varepsilon_{probe}}{\varepsilon_{ft}\eta}\right)^{1/4} T_{probe} \qquad \text{Eq 3}$$

with $\epsilon_{probe}$ and $\epsilon_{FT}$ the apparent emisivities of the probe 14 and the foil trap 4 respectively, and $\eta$ being a correction factor correcting for difference in the areas of the foil trap and the probe and the resulting difference in the intensity fraction of thermal radiation reaching the probe 14 radiated from the foil trap 4.

It can be seen that a change in apparent emissivity of the probe 14 and/or the foil trap 4 may be of considerable influence to a measured foil trap temperature. This is especially the case for Tin operated sources. In particular, a metal plate 7 covered with tin has an emissivity of 0.05. However, after venting, a formed tin oxide layer has an emissivity of 0.8. For the foil trap, the apparent emissivity of is close to 1 when covered with tin oxide, and about 0.45 when covered with Tin. Accordingly, due to a change in emissivity, in case of a foil trap covered with pure Tin, the measured foil trap temperature $T_{FT\_measured}$ can be overestimated with 64% to the actual foil trap temperature $T_{FT}$ due to a factor:

$$\frac{T_{FT\_measured}}{T_{FT}} = \left(\frac{\varepsilon_{probe\_ox}}{\varepsilon_{ft\_ox}}\right)^{1/4} \left(\frac{\varepsilon_{ft\_Sn}}{\varepsilon_{probe\_Sn}}\right)^{1/4} \qquad \text{Eq 4}$$

with $\epsilon_{probe\_ox}$; $\epsilon_{FT\_ox}$ being the apparent emissivity of the TIin oxidized probe 14 and the Tin oxidized foil trap 4 respectively (about 0.8 and 1 respectively); and $\epsilon_{probe\_Sn}$; $\epsilon_{FT\_Sn}$ being the apparent emissivity of the probe 14 covered with pure Tin and the foil trap 4 covered with pure Tin respectively (about 0.05 and 0.45 respectively). This change in apparent emissivity is most relevant just after starting the EUV source when the source 2 contaminates foil trap 2 and probe 14 with pure Tin. Calibrating the measurement for the case where both the probe 14 and the foil trap 4 are covered with pure Tin will result in a correct measurement after some time.

In embodiment depicted in FIG. 4, changes in emissivity of the foil trap 4 and/or the probe 14 can be mitigated by forming the probe 14 to substantially conform to a part of the geometry of the contamination barrier 4. Preferably, the probe 14 is formed to exactly conform to a part of the geometry of the contamination barrier 4. Thus, a probe 14 is provided having foils 15 arranged according to the foil structure of the foil trap 4, in particular, in the embodiment depicted in FIG. 4, a segment 16 of radially oriented foils 15 where a thermocouple sensor 17 is arranged near the top 18 of the segment 16, preferably, in a central foil 19. In the vicinity of the central foil 19 additional thermocouple sensors may be provided (not shown) for spatial averaging and improving the sensor reliability. This embodiment has as advantage that it is less sensitive to the apparent emissivity factor c variations of the foil trap and/or the probe 14.

Indeed, in this way, the E factors in Eq 3 and Eq 4 will be cancelled since the apparent emissivities of $\epsilon_{plate}$ and $\epsilon_{FT}$ will be about equal, irrespective of whether covered by pure Tin or tin oxide due to the identical geometry. From Eq 4 it can be seen that in that case the measured foil trap temperature (which derives from the probe temperature by proper calibration) equals the actual temperature.

Figure 5:
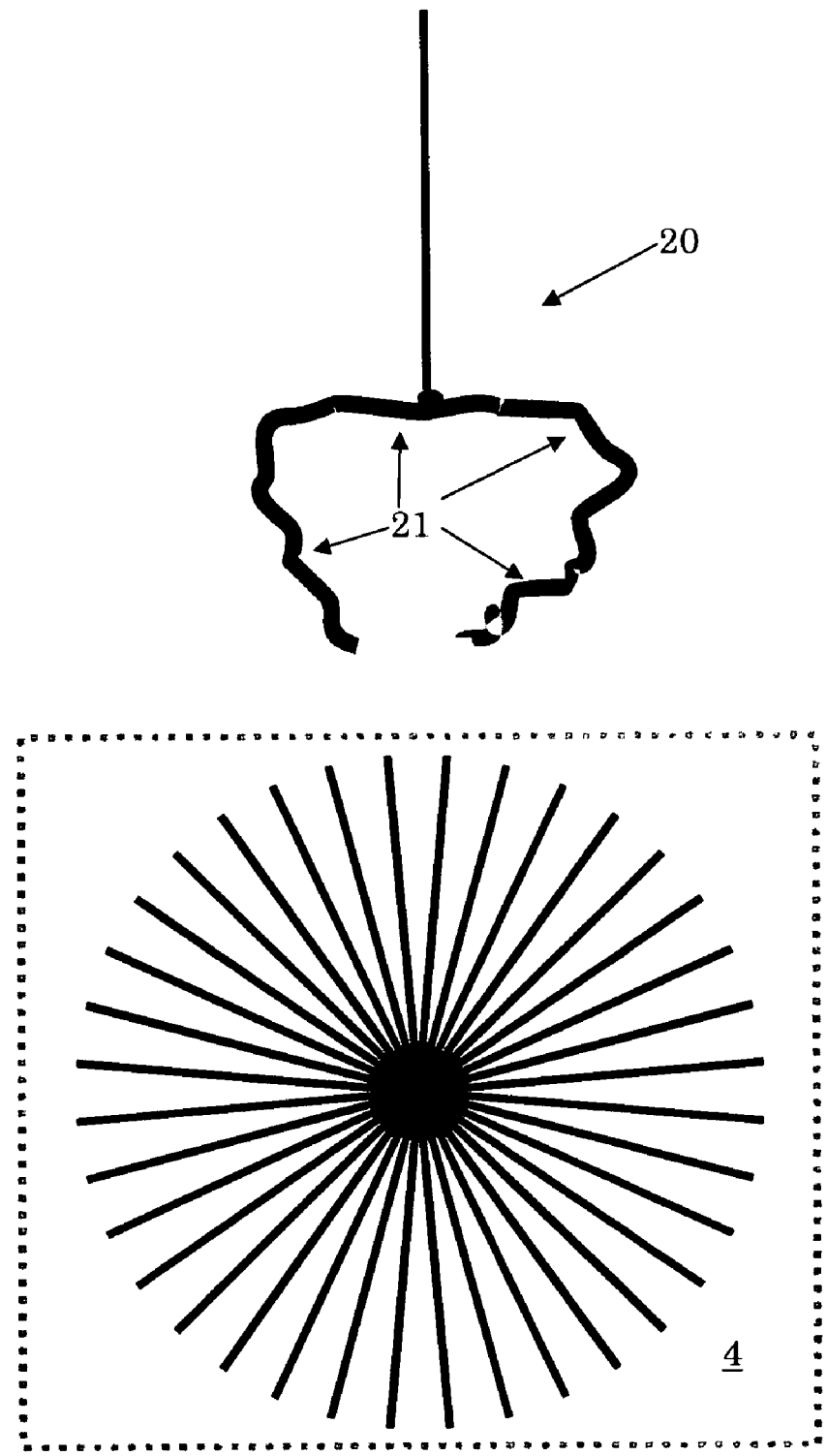
FIG. 5 depicts another embodiment according to the invention.

As an alternative to the FIG. 4 embodiment, FIG. 5 shows an arrangement wherein the apparent emissivity of the probe is increased to a value close to 1 through an appropriate geometric shape, irrespective of whether the walls are covered with Tin or with Tin oxide. Accordingly, the probe is formed to substantially conform to a blackbody geometry, which means it has an apparent emissivity matching a blackbody. This can be provided by a concave shape of the probe 20 for providing a high apparent emissivity. In general, a concave form of a radiating body increases it's apparent emissivity through reflection of heat radiation and thus increasing a local heat energy field.

In the arrangement of FIG. 5, for a foil trap and probe covered with Tin, the measured temperature equals 0.82 times the actual foil trap temperature: measurement underestimates the foil trap temperature with 18%. In other words, increasing the apparent emissivity of the probe results in an improvement of the accuracy of the temperature measurement. This apparent emissivity can be provided by forming a labyrinth of surfaces 21 for generating heat radiation that can be recycled through reflection and emittance of the surfaces.

Figure 6:
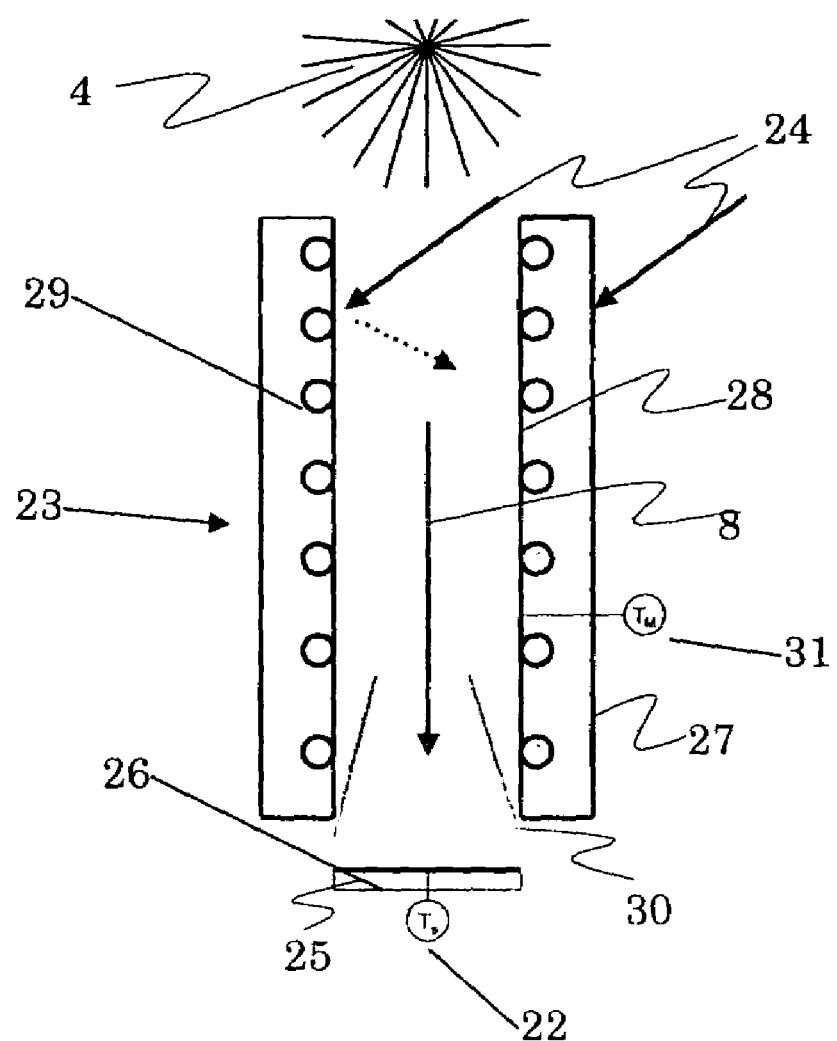
FIG. 6 depicts another embodiment according to the invention.

FIG. 6 is a schematic view of another embodiment of the invention. This embodiment, unlike the embodiments discussed with reference to FIGS. 4 and 5, does not use a cavity principle with a concave shaped probe to provide a blackbody geometry for improved temperature sensing. Instead, according to the embodiment of FIG. 6, a direct contactless temperature measurement is carried out by using a temperature measurement system comprising a temperature regulated aperture 23. By using a temperature regulated aperture 23, a stable thermal environment may be created for a temperature sensor 22, as the aperture 23 is constructed and arranged to block temperature sources 24 that are present outside a line of sight towards the foil trap 4. In comparison to the embodiments depicted in the previous figures, this embodiment is less suitable for outside heat sources 24 that are apart from the foil trap 4, for example, a tin melting bath, or a foil trap heater. Furthermore, in view of the direct incidence ofthermal radiation from the foil trap 4 on the sensor plate 25, which can have a small thermal capacity, fast response of the temperature sensor 22 may be provided.

In the illustrated embodiment, infrared radiation 8 travels through a structure having upstanding walls 27, 28, here depicted as a cylinder, onto a sensor plate 25 in which the temperature sensor 22 is mounted. Preferably, the sensor plate 25 is small and light and made from a high thermal conductive material, resulting in a small time constant. Furthermore, preferably, the side 26 of the plate 25 that is facing the foil trap 4 has a high emissivity, where the other side has a low emissivity, which increases the sensor sensitivity for infrared radiation from the foil trap 4, but decreases the sensor sensitivity for other sources. Infrared radiation from other sources 24, possibly including direct radiation from the radiation source 2, is in the depicted embodiment reflected by upstanding outer walls 27 of the aperture 23 which function as an outer reflection shield. Preferably, this material has a low emissivity, for example, polished aluminum or stainless steel. The inner walls 28 of the aperture 23 are temperature conditioned (e.g. by liquid flow conditioning circuit 29) and are preferably of a good temperature absorbing material, such as a high emissivity coating like glass or ceramic or very rough surfaces, fins etc. The high thermal radiation absorption properties of the inner walls 28 will prevent incidence of thermal radiation of other sources 24 onto the sensor plate 25, resulting in a sensitive temperature measurement system. The effect of the other sources 24 will be minimized, thereby resulting in low noise from other sources 24 onto the sensor plate 25. In addition, optionally, an extra reflection shield 30 may be present inside the aperture 23 to increase the sensitivity of the sensor. The addition of the extra reflection shield 30 should increase the sensitivity and increases the time constant. Also, an additional temperature sensor 31 may be present within the cylinder to measure a temperature difference between the sensor plate 25 and the aperture inner wall 28. By measuring the temperature difference between aperture inside wall 28 and the sensor plate 25, the sensor becomes less dependent on temperature fluctuations of the aperture inner wall 28. The sensitivity will therefore increase as noise from temperature fluctuations of the aperture inner wall 28 will not influence the signal. In addition, the sensor has improved mounting flexibility due to the increased sensitivity and can therefore be mounted near the foil trap in a variety of positions, in particular, in order to prevent or minimize Tin contamination. By minimizing dimensions of the sensor plate and protecting cylinder, the reaction time may be increased. Accordingly, a reliable, fast, and relatively cost efficient temperature sensor may be provided.

According to an aspect of the invention, a calibration is carried out on the temperature sensor arrangement, in order to correct for a delayed time response of the temperature sensor. Typically, the temperature sensor will respond with a small delay to changes in temperature of the foil trap 4. The time-varying temperature of the RFT (T_RFT) can be determined from the sensor temperature (T_SENS) as follows:

$$T\_RFT4 = A*T\_SENS4 + B*T\_SENS + C*dT\_SENS/dt + D \qquad \text{Eq 5}$$

With dT_SENS/dt being the time-derivative of the sensor temperature (i.e. temperature change per time unit) and A, B, C, D calibration constants.

Figure 7:
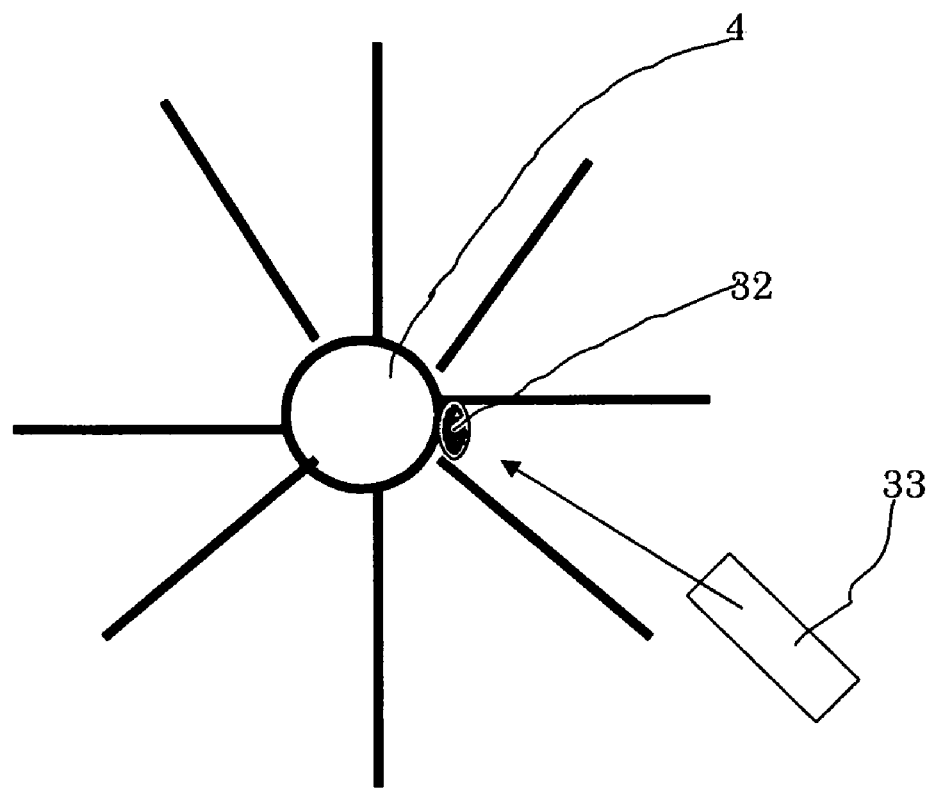
FIG. 7 depicts yet another embodiment according to the invention.

FIG. 7 illustrates another embodiment of a temperature converter 32 for converting sensed heat into a detectable signal that is indicative of a temperature of a contamination barrier, here illustrated again as a rotatable foil trap 4. The embodiment of FIG. 7 uses a conversion mechanism to convert sensed heat into a temperature signal that is transmitted towards a temperature signal receiver 33, which may be in the form of a detector. The conversion mechanism may be a transducer that deforms as a function of temperature and can be assessed visually by the detector 33. Also, the conversion mechanism can be a transducer that changes color with temperature and may be assessed visually by the detector 33. Other, non visible forms of assessment using electromagnetic radiation are also possible.

In FIG. 7, the rotating foil trap 4 is shown having the temperature converter 32 attached to it. This temperature converter 32 typically shows a visible change depending on temperature and this visible change is detected by the detector 33 in the form of camera. Visible changes can be detected by temperature effects acting on, including but not limited to, a bi-metal, which bends as the temperature changes; a heat-sensitive layer, which changes in color with temperature; or a thermometer (such as the common YIg thermometer), which thermally expands.

Also, the foil trap 4 may be equipped with multiple temperature converters (not shown), which may be useful in providing a more stable rotation of the foil trap 4 and which may increase a reliability of a temperature measurement. Although the principle has been shown in relation with foil traps, typically, also other components of the EUV system, in particular, components which are difficult to reach and which may suffer from thermal effects, may be monitored in this way.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A radiation system for generating a beam of radiation comprising:
   an extreme ultraviolet radiation source constructed and arranged to generate extreme ultraviolet radiation;
   a contamination barrier constructed and arranged to trap contamination from said radiation source; and
   a temperature sensor constructed and arranged to measure a temperature of said contamination barrier.

2. A radiation system according to claim 1, wherein the temperature sensor comprises a probe facing the contamination barrier and is arranged to be heated contactlessly by said contamination barrier.

3. A radiation system according to claim 2, wherein said probe is formed to substantially conform to a geometry of the contamination barrier.

4. A radiation system according to claim 2, wherein said probe is formed to substantially conform to a blackbody geometry.

5. A radiation system according to claim 4, wherein said blackbody geometry is provided by a concave shape for providing a high apparent emissivity.

6. A radiation system according to claim 2, wherein said probe is thermally isolated on sides not facing the contamination barrier.

7. A radiation system according to claim 2, wherein said probe comprises a metal plate.

8. A radiation system according to claim 7, wherein said metal plate is tin covered.

9. A radiation system according to claim 2, wherein a thermocouple sensor is coupled to said probe and is arranged to be heated only by direct thermal contact with the probe.

10. A radiation system according to claim 2, further comprising a temperature regulated aperture constructed and arranged to block heat radiation from ambient heat sources from reaching the probe and to allow heat radiation from the contamination barrier to reach the probe.

11. A radiation system according to claim 10, wherein the temperature regulated aperture comprises upstanding walls provided with a temperature conditioning circuit.

12. A radiation system according to claim 11, wherein the upstanding walls have a low emissivity on the outside and a high emissivity on the inside.

13. A radiation system according to claim 1, further comprising a heater at least partly enclosing said contamination barrier.

14. A radiation system according to claim 1, wherein said temperature sensor is coupled directly to the contamination barrier.

15. A radiation system according to claim 14, wherein said contamination barrier is of a rotating type, and wherein said temperature sensor is coupled to a rotation axis of the contamination barrier.

16. A radiation system according to claim 1, wherein said contamination barrier is of a rotating foil trap type.

17. A radiation system according to claim 1, wherein said extreme ultraviolet radiation source is a laser induced plasma source.

18. A radiation system according to claim 17, wherein said plasma source comprises Tin, Lithium, or Xenon.

19. A radiation system according to claim 1, wherein a temperature converter is attached to the contamination barrier, said temperature converter being constructed and arranged to convert sensed heat into a signal indicative of a temperature, and wherein a temperature signal receiver is provided to receive said signal from said temperature converter.

20. A radiation system according to claim 19, wherein said contamination barrier is rotatable.

21. A radiation system according to claim 19, wherein the converter deforms as a function of temperature, and wherein the temperature signal receiver comprises an image detector configured to visually assess said deformation.

22. A radiation system according to claim 19, wherein the converter changes color with temperature, and wherein the temperature signal receiver comprises an image detector for visually assessing said color change.

23. A radiation system according to claim 1, wherein the extreme ultraviolet radiation has a wavelength in the range of about 5-20 nm.

24. A radiation system for generating a beam of radiation comprising:
   an extreme ultraviolet radiation source constructed and arranged to generate extreme ultraviolet radiation;
   a contamination barrier constructed and arranged to trap contamination from said radiation source; and
   a temperature control system constructed and arranged to control the temperature of said contamination barrier.

25. A radiation system according to claim 24, wherein said temperature control system comprises a temperature sensor configured to measure the temperature of the contamination barrier.

26. A radiation system according to claim 24, further comprising a heater at least partly enclosing said contamination barrier configured to heat the contamination barrier.

27. A radiation system according to claim 24, wherein the extreme ultraviolet radiation has a wavelength in the range of about 5-20 nm.

28. A lithographic apparatus comprising:
   a radiation system constructed and arranged to generate a beam of radiation, said radiation system comprising
      an extreme ultraviolet radiation source constructed and arranged to generate extreme ultraviolet radiation;
      a contamination barrier constructed and arranged to trap contamination from said radiation source; and
      a temperature sensor constructed and arranged to measure a temperature of said contamination barrier;
   a patterning device constructed and arranged to pattern the beam of radiation; and
   a projection system constructed and arranged to project the patterned beam of radiation onto a substrate.

29. A lithographic apparatus according to claim 28, wherein the radiation system further comprises a temperature control system configured to control the temperature of said contamination barrier.

30. A lithographic apparatus according to claim 28, wherein the extreme ultraviolet radiation has a wavelength in the range of about 5-20 nm.

* * * * *